United States Patent [19]

Hsu

[11] Patent Number: 5,574,685
[45] Date of Patent: Nov. 12, 1996

[54] SELF-ALIGNED BURIED CHANNEL/JUNCTION STACKED GATE FLASH MEMORY CELL

[75] Inventor: James Hsu, Saratoga, Calif.

[73] Assignee: Advanced Micro Devices, Inc., Sunnyvale, Calif.

[21] Appl. No.: 299,876

[22] Filed: Sep. 1, 1994

[51] Int. Cl.[6] ............................................. G11C 16/04
[52] U.S. Cl. ........................... 365/185.18; 365/185.06; 365/185.11; 365/185.33; 257/316; 257/321; 257/339
[58] Field of Search ......................... 365/185.01, 185.06, 365/185.11, 185.33, 185.18; 257/321, 316, 339

[56] References Cited

U.S. PATENT DOCUMENTS

| | | | |
|---|---|---|---|
| 4,996,571 | 2/1991 | Kume et al. | 365/185.06 |
| 5,021,848 | 6/1991 | Chiu | 257/321 |
| 5,300,802 | 4/1994 | Komori et al. | 257/316 |
| 5,337,274 | 8/1994 | Ohji | 365/185.01 |
| 5,345,104 | 9/1994 | Prall et al. | 257/316 |
| 5,455,790 | 10/1995 | Hart et al. | 365/185.11 |
| 5,461,249 | 10/1995 | Ozawa | 365/185.01 |
| 5,464,999 | 11/1995 | Bergemont | 365/185.01 |
| 5,468,981 | 11/1995 | Hsu | 257/316 |
| 5,477,072 | 12/1995 | Goo | 257/316 |

Primary Examiner—Joseph E. Clawson, Jr.
Attorney, Agent, or Firm—Davis Chin

[57] ABSTRACT

An improved one-transistor flash EEPROM cell structure and a method for making the same is provided so that the effective channel length dimension is independent of the critical dimensions of the stacked gate structure. The cell structure (210) includes an $n^-$ buried channel/junction region (216) which is implanted in a substrate (212) before formation of a tunnel oxide (226) and a stacked gate structure (234). After the formation of the stacked gate structure, a p-type drain region (222) is implanted with a large tilt angle in the substrate. Thereafter, $n^+$ source and $n^+$ drain regions (218, 224) are implanted in the substrate so as to be self-aligned to the stacked gate structure. The cell structure of the present invention facilitates scalability to small size and is useful in high density application.

5 Claims, 1 Drawing Sheet

5,574,685

SELF-ALIGNED BURIED CHANNEL/JUNCTION STACKED GATE FLASH MEMORY CELL

BACKGROUND OF THE INVENTION

1. Field of the Invention

This invention relates generally to floating gate memory devices such as electrically erasable and programmable read-only memory devices (EEPROMs) and a method for making the same. More specifically, the present invention is directed to the structure and manufacture of an improved single-transistor EEPROM cell suitable for use in high density application.

2. Description of the Prior Art

As is generally known in the art, there exists a class of non-volatile memory devices referred to as "flash EEPROMs" which has recently emerged as an important memory device by combining the advantages of EPROM density with EEPROM electrical erasability. Such flash EEPROMs provide electrical erasing and a small cell size. FIG. 1 illustrates a prior art cross-sectional view of an asymmetrical flash EEPROM cell 10. The EEPROM cell is formed of a substrate 12, typically of a p-type conductivity, having embedded therein an $n^+$ drain region 14 and an n-type double-diffused source region 16. The double-diffused source region 16 is formed of a deeply diffused but lightly doped n-junction 18 and a more heavily doped but shallower $n^+$ junction 20 embedded within the deep n-junction 18. The deeply diffused n-junction 18 is typically formed by using a phosphorous implant, and the shallower $n^+$ junction 20 is typically formed by using an arsenic implant after the phosphorous implant.

A relatively thin gate dielectric layer 22 (i.e., silicon dioxide having a uniform thickness of about 100 Å) is interposed between the top surface of the substrate 12 and a conductive polysilicon floating gate 24. A polysilicon control gate 26 is insulatively supported above the floating gate 24 by an interpoly dielectric layer 28. The floating gate 24, interpoly dielectric layer 28, and control gate 26 define a stacked gate structure. A channel region 30 in the substrate 12 separates the drain region 14 and the source region 16. The entire structure is overlaid by an oxide insulating layer 32 so as to isolate the transistor cell structure from periphery devices. Further, there are provided means for applying a source voltage $V_S$ through the oxide layer 32 to the source region 16, a gate voltage $V_G$ to the control gate 26, and a drain voltage $V_D$ through the oxide layer 32 to the drain region 14.

According to conventional operation, the flash EEPROM cell of FIG. 1 is "programmed" by applying a relatively high voltage $V_G$ (approximately +12 volts) to the control gate 26 and a moderately high voltage $V_D$ (approximately +9 volts) to the drain 14 in order to produce "hot" (high energy) electrons in the channel 30 near the drain 14. The hot electrons are generated and accelerated across the gate dielectric 22 and onto the floating gate 24 and become trapped in the floating gate since the floating gate is surrounded by insulators. As a result, the floating gate threshold may be increased by 3 to 5 volts. This change in the threshold voltage, or channel conductance, of the cell created by the trapped hot electrons is what causes the cell to be programmed.

In order to erase the flash EEPROM cell of FIG. 1, the relatively high voltage $V_S$ (approximately +12 volts) is applied to the source 16 while the control gate 26 is grounded ($V_G=0$). The drain 14 is usually allowed to float. Under these conditions, a strong electric field is developed across the tunnel oxide between the floating gate and the source region. The electrons trapped in the floating gate flow toward and cluster at the portion of the floating gate overlying the $n^+$-type source region 16 and are extracted from the floating gate 24 to the source 16 by way of Fowler-Nordheim (F-N) tunneling.

High program and erase voltages for such conventional EEPROM devices are of major concern. Such a requirement has led to a need for a separate high voltage power supply when operating these devices by the provision of a special charge pumping circuit for boosting the power supply voltages to the requisite program and erase levels. The flash EEPROM cell of FIG. 1 suffers from another disadvantage in that the effective channel length $L_{eff}$ in the p-type substrate will be sensitive to the critical dimensions of the stacked gate structure which is subject to variations and is difficult to precisely control. As a result, the conventional EEPROM cell is incapable of providing scalability to small size (i.e., from 1 micron technology to a sub-half micron design).

It would therefore be desirable to provide an improved single-transistor EEPROM cell structure and a method for making the same so that the effective channel length dimension is independent of the critical dimensions of the stacked gate structure. Further, it would be expedient that the cell structure be able to facilitate scalability to small size and be suitable for use in high density application.

SUMMARY OF THE INVENTION

Accordingly, it is a general object of the present invention to provide an improved single-transistor EEPROM cell structure which overcomes the disadvantages of the prior art flash EEPROM memory devices.

It is an object of the present invention to provide an improved single-transistor EEPROM cell structure and a method for making the same so that the effective channel length dimension is independent of the critical dimensions of the stacked gate structure.

It is another object of the present invention to provide an improved single-transistor EEPROM cell structure which facilitates scalability to small size and is suitable for use in high density application.

It is still another object of the present invention to provide an improved single-transistor EEPROM cell structure which has a relaxed source junction breakdown so as to minimize band-to-band tunneling induced leakage current.

In accordance with these aims and objectives, the present invention is concerned with the provision of a single-transistor EEPROM cell structure which includes a silicon semiconductor substrate. An $n^-$ buried channel/junction region is disposed in the substrate. An $n^+$-type source region is disposed in the substrate and on one side of the $n^-$ buried channel/junction region defining a source side. A drain structure is disposed in the substrate and on the other side of the $n^-$ buried channel/junction region defining a drain side. The drain structure includes a first p-type drain region and a second $n^+$-type drain region disposed in the first p-type drain region. A tunnel oxide is disposed on the substrate. A stacked gate structure is disposed on the tunnel oxide.

In another aspect of the present invention, there is provided a method of forming a self-aligned flash memory cell device on a silicon semiconductor substrate.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

The improved memory cell structure of the present invention is described in the context of a flash EEPROM cell. Such flash EEPROM cell may be formed by a single transistor. It should be clearly understood to those skilled in the art that the improved flash EEPROM cell structure of the present invention has many uses in other applications. Specifically, the EEPROM cell of the present invention may be utilized in electrically erasable programmable logic arrays and other programmable logic devices.

Figure 2:
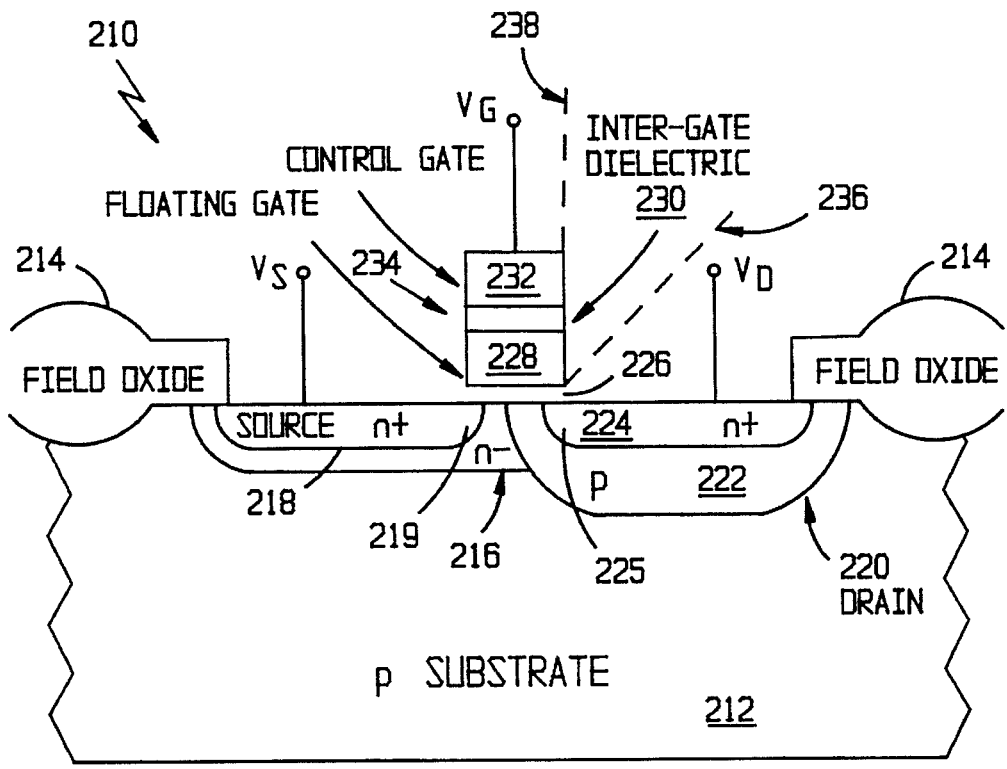
" and FIG. 2 illustrates a cross-sectional view of a single-transistor EEPROM cell, constructed in accordance with the principles of the present invention.

Referring now to FIG. 2 of the drawings, there is shown a stacked gate, one-transistor memory cell structure 210 which is constructed in accordance with the principles of the present invention. The memory cell structure is formed in a portion of a substrate 212 which is isolated by field oxide regions 214. The substrate 212 is usually formed of a p-type semiconductor material. An $n^-$ buried channel/junction region or layer 216 is implanted in the substrate 212. The substrate is also provided with an $n^+$-type source region 218 and a drain structure 220 embedded therein. The drain structure 220 includes a first p-type implant and diffusion region 222 and a second $n^+$-type region 224 formed in the region 222.

A tunnel oxide 226 of a uniform thickness is provided on the top surface of the substrate 212. The tunneling oxide 226 has a thickness of approximately 100 Å, but may be made to be smaller (i.e., in the range between 50–90 Å) for sub-micron technologies. A polysilicon floating gate 228 is provided on the tunneling oxide 226, and an inter-gate dielectric 230 separates the floating gate 228 from a control gate 232. The floating gate 228, inter-gate dielectric 230, and control gate 232 define a stacked gate structure 234. As can be seen, the stacked gate structure 234 is formed over the $n^-$ buried channel/junction region 216 and extends between the source region 218 and the drain region 220. It is to be noted that the tunneling oxide overlies the portion 219 of the $n^+$ source region 218, the p-type drain region 222, and a portion 225 of the $n^+$-type drain region 224. Further, there are provided means for applying a source voltage $V_S$ to the source region 218, a gate voltage $V_S$ to the control gate 232, and a drain voltage $V_D$ to the drain region 224.

Figure 1:
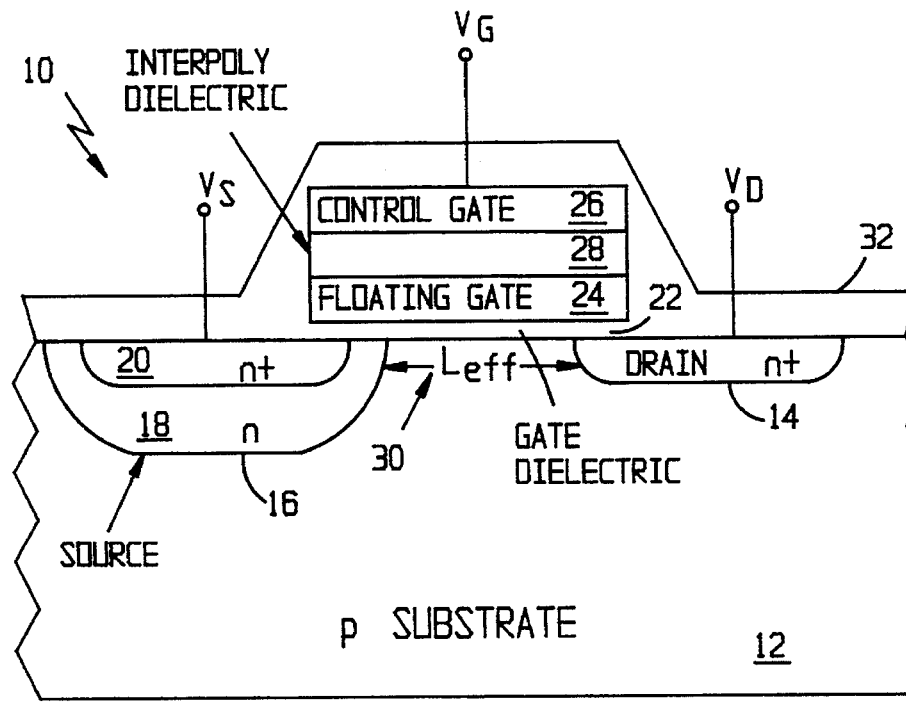
FIG. 1 illustrates a cross-sectional view of a conventional asymmetric flash EEPROM cell and has been labeled "Prior Art.

The $n^-$ buried channel region 216 serves to greatly increase the source junction breakdown voltage due to less electrical field resulted from the $n^+/n^-$ junction. The reduced generation of hot holes is useful in minimizing the band-to-band tunneling induced leakage current and also hot hole trapping in the tunnel oxide, thereby rendering better erase distribution and reliability. Since a moderately high voltage $V_D$ is applied to the drain and a relatively high voltage $V_G$ is applied to the gate during programming which is identical to the conventional operation of the flash EEPROM cell of FIG. 1, hot electrons are accelerated across the gate dielectric 226 and onto the floating gate 228 and become trapped in the floating gate.

On the other hand, during erase a relatively high voltage $V_S$ is applied to the source and the gate is grounded (or a negative voltage $-V_G$ is applied to the gate) with the drain left floating. As a result, F-N tunneling occurs from the floating gate to the source side so as to discharge the floating gate. It should be appreciated from the foregoing description that both the write (programming) and erase operations in the cell structure of the present invention are identical to the operation for the EEPROM cell 10 of FIG. 1. Thus the structure 110 is suitable for use in high density application.

The p-type implant and diffusion region 222, provided on the drain side, renders the actual channel length of the cell to be set and completely independent of the critical dimensions of the stacked gate structure 234. Moreover, the p-type region 222 in conjunction with the $n^-$ buried channel region 216 further results in an even greater improvement over the prior art EEPROM cell structure of FIG. 1 as this feature enhances hot electron generation. Consequently, this enhances the programming speed of the cell.

The fabrication of the flash memory cell in accordance with the present invention includes the following steps: First, field oxide regions 214 are formed on the substrate 212 so as to separate the areas where multiple flash EEPROM cells will be formed on the single substrate. The $n^-$ buried channel/junction region 216 is implanted in the substrate 212 after LOCOS (local oxidation of silicon). The dopant used for the $n^-$ buried channel region 216 is phosphorous with a density in the range of $1\times10^{13}$ to $3\times10^{14}$ ions/cm². The depth of this $n^-$ buried channel/junction phosphorous diffusion is preferably between 1000–2000 Å, depending on actual device size. The tunnel oxide 226 is then grown on the surface of the substrate 212. Next, the stacked gate structure 234, including the floating gate 228, intergate dielectric 230 (usually silicon oxide or a combination of silicon oxide and nitride) and the control gate 232, is formed on the tunnel oxide 226. In accordance with conventional manufacturing techniques, the various elements of the stacked gate structure 234 are formed as continuous layers and are then etched to achieve the final structure.

After the stacked gate structure 234 is formed, a first side of the cell, which is to become the source, is masked, and the p-type region 222 is formed by implanting on a second or drain side of the cell with a large tilt angle. The term "large tilt angle" refers to the angle between a line 236 with respect to the line 238 disposed perpendicularly to the stacked gate structure 234. Preferably, the large tilt angle is in the range of 15° to 45°. The p-type region 222 is implanted in the substrate utilizing a p-type dopant (i.e., boron ions) with a density in the range of $5\times10^{13}$ to $8\times10^{14}$ ions/cm² and an energy ranging from 20–70 Kev and driving the implanted ions with a thermal cycle.

Finally, the $n^+$ source region 218 and the $n^+$ drain region 224 are implanted in the substrate utilizing an arsenic dopant with an energy ranging from 30–70 Kev and thermally driven. Since the stacked gate structure 234 is formed prior to implanting the drain region 224 and the source region 218, the source and drain are self-aligned with the stacked gate structure 234.

From the foregoing detailed description, it can thus be seen that the present invention provides an improved one-transistor EEPROM cell structure and a method for making the same so as that the effective channel length dimension is independent of the critical dimensions of the stacked gate structure. The cell structure includes an $n^-$ buried channel/junction region which is implanted before the formation of a tunnel oxide and a stacked gate structure. After the stacked gate formation, a p-type drain region is implanted in the substrate with a large tilt angle. Thereafter, $n^+$ source and $n^+$ drain regions are implanted in the substrate which are self-aligned to the stacked gate structure.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A one-transistor memory cell structure comprising:

a substrate (212);

an $n^-$ buried channel/junction region (216) disposed in said substrate;

an $n^+$-type source region (218) disposed in said substrate and on a first side of said buried channel/junction region defining a source side;

a drain structure (220) disposed in said substrate and on a second side of said $n^-$ buried channel/junction region defining a drain side;

said drain structure including a first p-type drain region (222) and a second $n^+$-type drain region (224) disposed in said first p-type drain region;

said p-type drain region (222) being formed by implanting on the drain side with a large tilt angle with respect to a line disposed perpendicularly to said stacked gate structure so as to cause the channel length of the memory cell to be set on the drain side and to be made independent of critical dimensions of said stacked gate structure;

a tunnel oxide (226) disposed on said substrate;

a stacked gate structure (234) disposed on said tunnel oxide and being formed over said n-channel/junction region (216);

said stacked gate structure (234) including a floating gate (228), an inter-gate dielectric (230) disposed on said floating gate, and a control gate (232) disposed on said inter-gate dielectric;

said tunnel oxide (226) overlying a portion (219) of said $n^+$-type source region (218), said first p-type drain region (222), and a portion (225) of said second $n^+$ drain region (224);

means for applying a moderately high voltage ($V_D$) to said second $n^+$-type drain region (224) and a relatively high voltage ($V_G$) to said control gate (232) so as to cause hot electron injection into said floating gate (228) through said tunnel oxide (226) from said drain structure during programming; and means for applying a relatively high voltage ($V_S$) to said source region (218) and a ground potential to said control gate (232) so as to cause Fowler-Nordheim electron tunneling from said floating gate (228) through said tunnel oxide (226) to said source region (218) during an erase operation.

2. A one-transistor memory cell structure as claimed in claim 1, wherein said $n^-$ buried channel/junction region (216) has a depth in the range of 1000 to 2000 Å which extends below the surface of said substrate.

3. A one-transistor memory cell structure as claimed in claim 2, wherein said $n^-$ buried channel/junction region (216) is formed by implanting phosphorous ions with a density in the range of $1 \times 10^{13}$ to $3 \times 10^{14}$ ions/cm$^2$.

4. A one-transistor memory cell structure as claimed in claim 1, wherein said p-type drain region (222) is formed by implanting boron ions with a density of $5 \times 10^{13}$ to $8 \times 10^{14}$ ions/cm$^2$.

5. A one-transistor memory cell structure as claimed in claim 1, wherein said tunnel oxide (226) has a thickness of less than approximately 100 Å.

* * * * *